US009562943B2

(12) United States Patent
Chuang et al.

(10) Patent No.: US 9,562,943 B2
(45) Date of Patent: Feb. 7, 2017

(54) WAFER TEMPERATURE SENSING METHODS AND RELATED SEMICONDUCTOR WAFER

(71) Applicant: Taiwan Semiconductor Manufacturing Company, Ltd., Hsin-Chu (TW)

(72) Inventors: Mei-Chen Chuang, Xinyuan Township (TW); Jui-Cheng Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 545 days.

(21) Appl. No.: 13/681,048

(22) Filed: Nov. 19, 2012

(65) Prior Publication Data

US 2014/0139246 A1    May 22, 2014

(51) Int. Cl.
*G01R 31/10*    (2006.01)
*G01R 31/28*    (2006.01)
*G01K 7/01*    (2006.01)

(52) U.S. Cl.
CPC ........... *G01R 31/2874* (2013.01); *G01K 7/015* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,625,288 | A * | 4/1997 | Snyder | G01R 31/2858 324/73.1 |
| 6,545,494 | B1 * | 4/2003 | Olsen | G05D 23/20 324/73.1 |
| 7,432,729 | B2 * | 10/2008 | Noel et al. | 324/750.05 |
| 7,576,553 | B2 * | 8/2009 | Lou | G01R 31/2891 324/750.03 |
| 9,134,367 | B2 * | 9/2015 | Pagani | G01R 1/06794 |
| 2002/0050834 | A1 * | 5/2002 | Olsen et al. | 324/760 |
| 2004/0046583 | A1 * | 3/2004 | Fan | G01R 1/0466 324/756.02 |
| 2010/0042355 | A1 * | 2/2010 | Aube et al. | 702/130 |
| 2011/0273186 | A1 * | 11/2011 | Karnad et al. | 324/555 |

* cited by examiner

*Primary Examiner* — Minh N Tang
(74) *Attorney, Agent, or Firm* — Slater Matsil, LLP (57) ABSTRACT

A method includes measuring a first voltage across a test diode on a semiconductor wafer while injecting a first current into the test diode, measuring a second voltage across the test diode while injecting a second current into the test diode, and determining temperature of a region proximate the test diode according to difference between the first voltage and the second voltage.

20 Claims, 4 Drawing Sheets

WAFER TEMPERATURE SENSING METHODS AND RELATED SEMICONDUCTOR WAFER

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). As device dimensions shrink, voltage nodes also shrink, with core device voltages trending toward less than 1 Volt, and input/output (I/O) device voltages under 2 Volts. Temperature variation of device parameters, such as transistor threshold voltage, is a concern as voltage nodes shrink. For example, transistor threshold voltage may vary on the order of single millivolts per degree Celsius (e.g., −4 mV/° C. to −2 mV/° C. depending on doping level). Integrated circuits (ICs) are expected to operate in large temperature ranges (e.g., 0° C. to 70° C. for "commercial" ICs), which correspond to large temperature variations (e.g., ±140 mV) that may be on the same order of magnitude as the device parameter (e.g., transistor threshold voltage of 450 millivolts). Characterization of circuit performance for temperature variation, therefore, is increasingly important.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely an integrated thermal sensor, and the like. Other embodiments may also be applied, however, to other types of thermal test circuits.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

IC performance is typically characterized for process, voltage, and temperature variation. Temperature variation characterization may be performed by attaching a wafer to a thermal chuck, which heats and/or cools the wafer to specific temperatures for circuit performance characterization. Absolute temperature of the wafer heated by the thermal chuck is not perfectly uniform. For example, the thermal chuck may be set to heat the wafer to 50° C., but the wafer may have regions with temperatures ranging from 46° C. to 50° C. Thus, a temperature profile of the thermal chuck is typically obtained through use of a thermal couple prior to testing the wafer for circuit performance under temperature variation. The temperature profile may be obtained by heating/cooling the wafer to various temperatures (e.g., −25° C., 0° C., 25° C., 50° C., and 70° C.), allowing temperature of the wafer to stabilize for 30 minutes to one hour, then obtaining a number of temperature data points at positions distributed over the surface of the wafer. For example, five data points spread over the surface of the wafer may be obtained for each temperature.

Three problems arise when using the thermal profile obtained through the thermal couple. First, the thermal couple is not able to provide an accurate reading of the temperatures at the various data points. For example, a typical thermal couple has temperature error in a range of about ±1-2° C. Second, during test, the wafer temperature must be allowed to stabilize for 30 minutes to one hour before circuit performance at the test temperature can be characterized. This greatly inhibits throughput, as each test temperature requires the stabilization period, and anywhere from 5 to 8 (or more) test temperatures may be characterized. Finally, distance from a temperature sensitive circuit under test to the nearest available data point on the thermal profile may be large, such that absolute temperature at the location of the circuit under test is hard to determine with any confidence.

In the following disclosure, a novel integrated thermal sensor and temperature characterization method are introduced. Through use of an integrated diode or bipolar junction transistor and four test contact pads, the thermal sensor can be placed anywhere on the wafer, has better accuracy than the thermal probe, allows for rapid determination of local temperature without need for stabilization, and saves layout space. The thermal sensor is small, and can be placed on a test line to obtain wafer temperature. The thermal sensor also relaxes accuracy and mismatch requirements on a trimming circuit that is common in voltage-to-frequency (V2F) and sigma-delta analog-to-digital converter (Σ-Δ ADC) sensing circuits.

Figure 1:
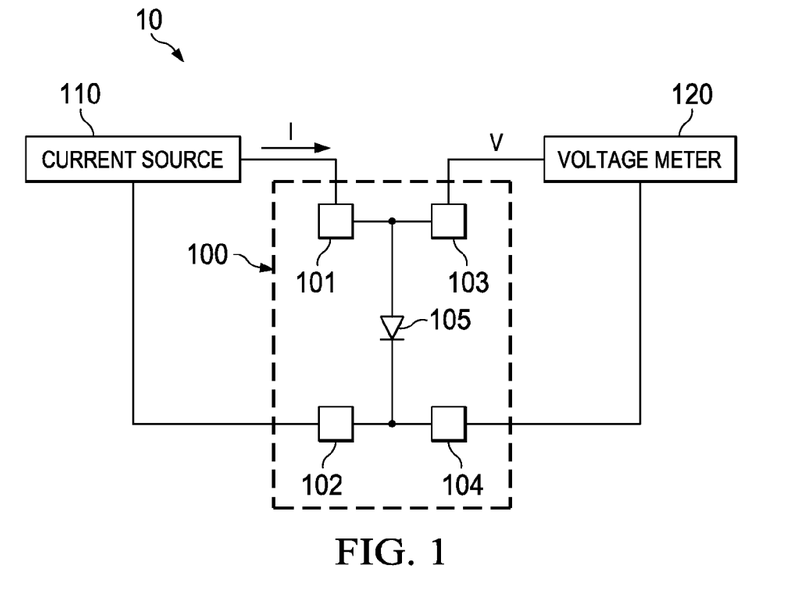
FIG. 1 shows a circuit diagram of a test system in accordance with various embodiments of the present disclosure.

A circuit diagram of a test system 10 in accordance with various embodiments of the present disclosure is shown in FIG. 1. A thermal sensor 100 receives current input from a current source 110, and outputs voltage to a voltage meter 120. The voltage outputted per unit current varies approximately linearly with temperature. The thermal sensor 100 is formed on a semiconductor wafer, for example. In some embodiments, the thermal sensor 100 is formed in a semiconductor package. The current source 110 and the voltage meter 120 may be external to the semiconductor wafer. Temperature of the semiconductor wafer near the thermal sensor 100 can be determined by applying two different currents to the thermal sensor 100 through the current source 110, and reading output voltages of the thermal sensor 100 corresponding to the two different currents through the voltage meter 120.

Placement of the thermal sensor 100 can be highly flexible, such as within an integrated circuit die, in a test line of the semiconductor wafer, in a scribe line, or the like. In a single semiconductor wafer, more than one of the thermal sensors 100 may be placed at locations throughout the semiconductor wafer. The thermal sensors 100 may be placed at regular intervals over the area of the semiconductor wafer to obtain a thermal profile thereof, for example. The thermal sensors 100 may also be placed proximate temperature sensitive circuits to get highly accurate temperature readings at sensitive areas of each integrated circuit die.

Current pads 101, 102 of the thermal sensor 100 are electrically connected to terminals of the current source 110 and terminals of a diode circuit 105 of the thermal sensor 100. The current pads 101, 102 may be metallic contact pads formed over the semiconductor wafer, and may contact the terminals of the diode circuit 105 through multiple metallization layers and contact vias, for example. The current pad 101 contacts an anode electrode of the diode circuit 105, and the current pad 102 contacts a cathode electrode of the diode circuit 105.

Voltage pads 103, 104 of the thermal sensor 100 are electrically connected to terminals of the voltage meter 120 and terminals of the diode circuit 105 of the thermal sensor 100. The voltage pads 103, 104 may be metallic contact pads formed over the semiconductor wafer, and may contact the terminals of the diode circuit 105 through multiple metallization layers and contact vias, for example. The voltage pad 103 contacts the anode electrode of the diode circuit 105, and the voltage pad 104 contacts the cathode electrode of the diode circuit 105.

The diode circuit 105 may be a PN-junction formed in the semiconductor wafer, a bipolar junction transistor (BJT) in diode-connected configuration, or the like. The diode circuit 105 has a well-defined relationship between change in voltage ($\Delta V$) to temperature. For example, the diode circuit 105 may be a BJT having a correlation between change in base-emitter voltage ($\Delta V_{BE}$) and temperature. A temperature dependence relationship of the diode circuit 105 may be given by the following equation:

$$\Delta V_{BE} = \frac{KT}{q} \times \ln\left(\frac{I_{C1}}{I_{C2}}\right) \quad (1)$$

where $V_{BE}$ is bandgap voltage of the diode circuit 105, K is Boltzmann's constant, T is temperature in kelvins, q is charge on an electron, and $I_{C1}$ and $I_{C2}$ are two different currents. Solving for temperature, the following equation is obtained from equation (1):

$$T = \frac{\Delta V_{BE} \times q}{K \ln(N)} \quad (2)$$

where N is the ratio of $I_{C1}$ to $I_{C2}$ (e.g., 2). For a ratio N of 2, a change in temperature T of 1° C. relates to a corresponding change in $\Delta V_{BE}$ of 59.7 µV, whereas for N=10, the corresponding change in $\Delta V_{BE}$ for each degree of temperature T increases to 198 µV, or about 0.2 mV.

In practical situations, the thermal sensor 100 may not have ideal performance over a target temperature range. For example, $\Delta V_{BE}$ may not be linearly correlated with temperature. For example, at environmental temperature of 0 degrees, the thermal sensor 100 may exhibit $\Delta V_{BE}$ corresponding to 2 degrees (error=2 degrees), and at environmental temperature of 100 degrees, the thermal sensor 100 may exhibit $\Delta V_{BE}$ corresponding to 98.5 degrees (error=− 1.5 degrees). The error may not be linearly correlated over temperature, either. Thus, the thermal sensor 100 may be calibrated through two-point calibration, for example. Multiple-point calibration may also be used to obtain a curve, and a linear approximation of the curve may be obtained through interpolation. Calibration parameters correlating $\Delta V_{BE}$ to temperature may be stored in a lookup table, or a calibration equation may be derived so that the temperature reading outputted by the thermal sensor 100 may be calibrated on the fly. Simulations have shown that the absolute temperature read by the thermal sensor 100 after calibration may achieve as good as ±0.75 degrees Celsius confidence.

The current source 110 may be external to the semiconductor wafer (e.g., a DC current supply), and is capable of inputting at least two different currents (e.g., the currents $I_{C1}$ and $I_{C2}$ in equation (1)) to the diode circuit 105 through the current pads 101, 102. For example, the current source 110 may input a first current to the diode circuit 105, then input a second current to the diode circuit 105 equal to double the first current. In general, the second current may be any multiple of the first current, and is not limited to integer multiples. And, order of inputting the first current and the second current may be reversed. As mentioned above, more than two currents may be inputted to determine the temperature of the diode circuit 105.

The voltage meter 120 may also be external to the semiconductor wafer, and is capable of sensing the bandgap voltage of the diode circuit 105 through the voltage pads 103, 104. The voltage meter 120 may draw little to no current when measuring the voltage across the voltage pads 103, 104, so as not to affect current flow through the diode circuit 105 set up by the current source 110. The voltage meter 120 may detect a first voltage (e.g., $V_{BE1}$) while the first current is inputted to the diode circuit 105 by the current source 110, and may further detect a second voltage (e.g., $V_{BE2}$) while the second current is inputted to the diode circuit 105 by the current source 110. Then, $\Delta V_{BE}$ can be calculated as $V_{BE2}-V_{BE1}$.

Figure 2:
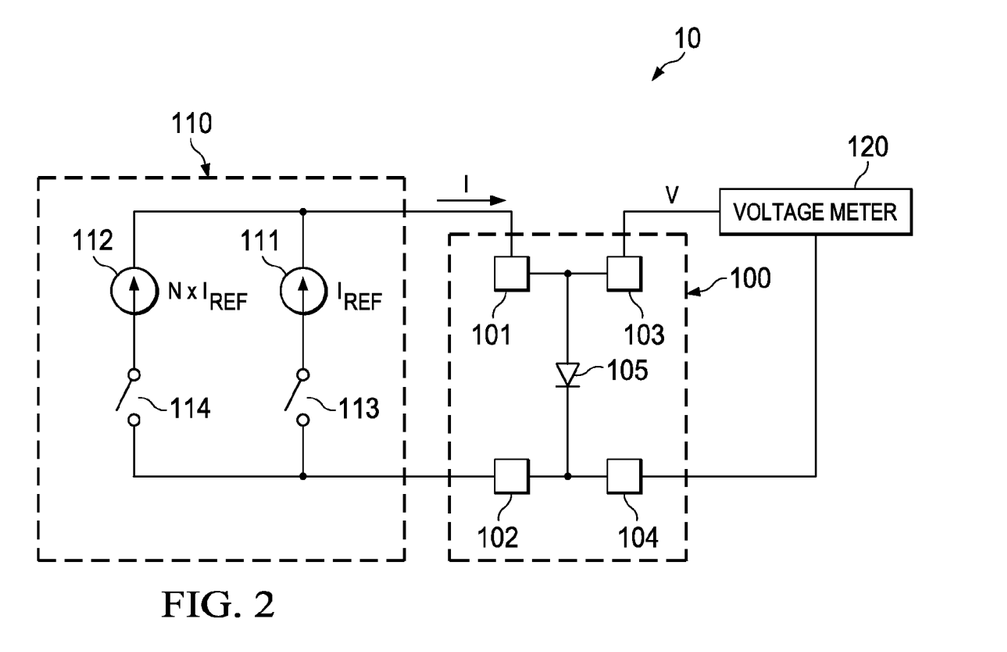
FIG. 2 shows a circuit diagram of a current source in accordance with various embodiments of the present disclosure.

A circuit diagram of one example of the current source 110 is shown in FIG. 2. A first current supply 111 is electrically connected across the current pads 101, 102 through a first switch 113. The first current supply 111 has a first terminal electrically connected to the current pad 101. The first switch 113 has a first terminal electrically connected to a second terminal of the first current supply 111, and a second terminal electrically connected to the current pad 102. The first switch 113 may be a MOSFET switch, a pass gate, or the like, and is controllable by an electrical input (e.g., a voltage) applied at a control terminal thereof. The first current supply 111 outputs a reference current $I_{REF}$, which may be a highly accurate current, such as a bandgap reference current.

A second current supply 112 is electrically connected across the current pads 101, 102 through a second switch 114. The second current supply 112 has a first terminal electrically connected to the current pad 101. The second switch 114 has a first terminal electrically connected to a second terminal of the second current supply 112, and a second terminal electrically connected to the current pad 102. The second switch 114 may be a MOSFET switch, a pass gate, or the like, and is controllable by an electrical input (e.g., a voltage) applied at a control terminal thereof. The second current supply 112 outputs a multiple of the reference current $I_{REF}$ (e.g., $N \times I_{REF}$), and may also be a highly accurate current, such as a bandgap reference current. The multiple N may be an integer multiple, for example, such as 2 or 10.

In some embodiments, the first switch 113 may be omitted or normally on, so that the first current supplied to the thermal sensor 100 is $I_{REF}$, and the second current supplied when the second switch 114 is turned on is $(N+1) \times I_{REF}$. For the example where N is 2, the first and second current supplies 111, 112 may be identical by using the switching scheme just described.

Figure 3:
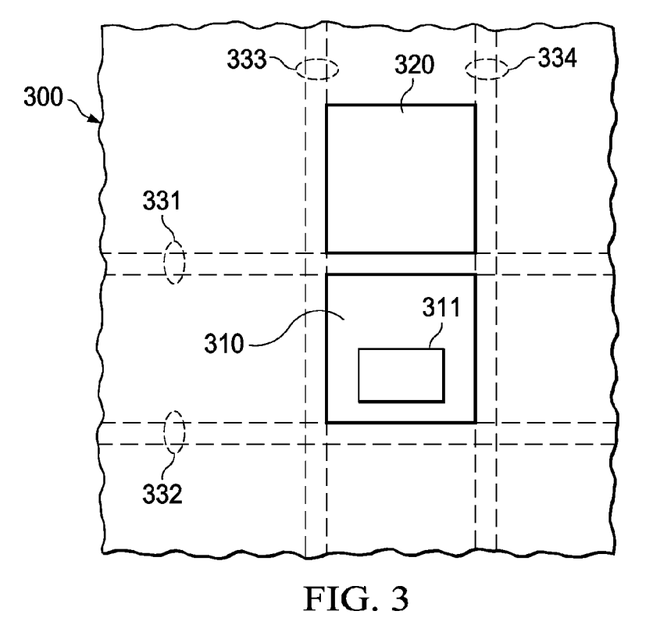
FIG. 3 shows a diagram of a semiconductor wafer in accordance with various embodiments of the present disclosure.

A semiconductor wafer 300 (or simply "wafer 300") in accordance with various embodiments of the present disclosure is shown in FIG. 3. Integrated circuit dies 310 and 320 (or simply "dies 310 and 320") are formed in and on the semiconductor wafer 300, and may include active circuits, passive circuits, and interconnect structures. A temperature-sensitive circuit 311 is formed in the integrated circuit die 310. Only two dies are shown in FIG. 3. A typical semiconductor wafer will be optimally filled with integrated circuit dies depending on dimensions of the dies. Horizontal scribe lines 331 and 332 and vertical scribe lines 333, 334 run between rows and columns of dies, respectively, and serve multiple purposes in fabrication of the integrated circuit dies. The scribe lines 331-334 physically isolate individual dies from each other, and provide a guideline for a diamond saw during singulation. Prior to singulation, the scribe lines 331-334 may also be used for placement of test circuits for testing electrical and functional characteristics of the dies 310, 320. The test circuits may also be placed within the dies 310, 320.

Figure 4:
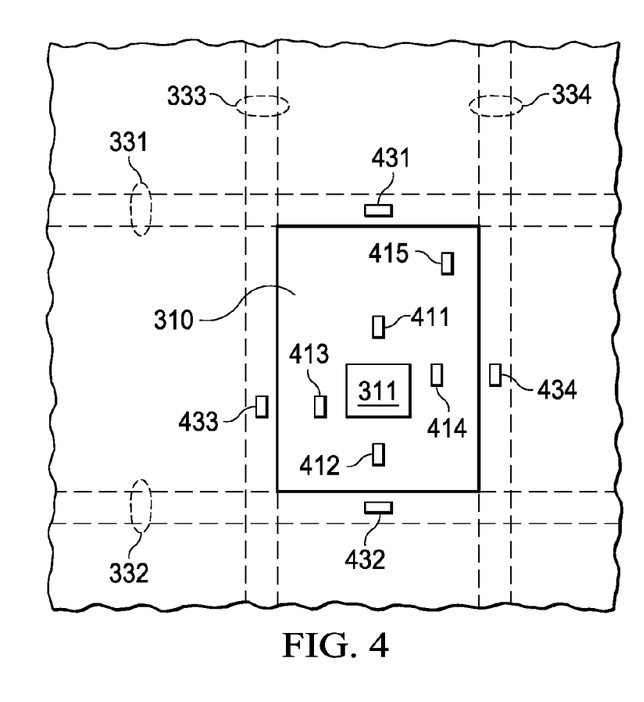
FIG. 4 shows a zoomed-in view of an integrated circuit die with thermal sensor location candidates in accordance with various embodiments of the present disclosure.

A zoomed-in view of the integrated circuit die 310 with thermal sensor location candidates 411-414, 431-434 in accordance with various embodiments of the present disclosure is shown in FIG. 4. The thermal sensor 100 of FIGS. 1 and 2 may be placed at various locations on the wafer 300. Candidate locations 411-414 reside within the integrated circuit die 310, whereas candidate locations 431-434 reside within the scribe lines 331-334, respectively. The candidate location 411 is located above and proximal to the temperature-sensitive circuit 311. The candidate location 412 is located below and proximal to the temperature-sensitive circuit 311. The candidate location 413 is located to the left of and proximal to the temperature-sensitive circuit 311. The candidate location 414 is located to the right of and proximal to the temperature-sensitive circuit 311. Another candidate location 415 is within the die 310, but relatively not proximal to the temperature-sensitive circuit 311. The candidate location 415 may be useful when insufficient space exists surrounding the temperature-sensitive circuit 311, for example.

The candidate locations 431-434 are located within the scribe lines 331-334. The candidate location 431 is located on the scribe line 331, which resides above the die 310, and is relatively not proximal the temperature-sensitive circuit 311 shown in FIG. 4. The candidate location 432 is located on the scribe line 332 below the die 310, and is relatively proximal the temperature-sensitive circuit 311. The candidate location 433 is located on the scribe line 333, and is both to the left of and relatively proximal to the temperature-sensitive circuit 311. The candidate location 434 is located on the scribe line 334, and is both to the right of and relatively proximal to the temperature-sensitive circuit 311. Embodiments where the temperature-sensitive circuit 311 is proximal to one, two, three or all four of the scribe lines 331-334, and placement of the thermal sensor 100 in candidate positions proximal and/or relatively not proximal to the temperature-sensitive circuit 311 are contemplated herein. Embodiments in which multiple temperature-sensitive circuits are located within the die 310, and at least one thermal sensor is formed proximate each temperature-sensitive circuit are also contemplated herein.

Advantageously, the candidate positions 411-414 are very close to the temperature-sensitive circuit 311, which ensures good knowledge of temperature of the wafer 300 in the region in which the temperature-sensitive circuit 311 is located. Locating the thermal sensor 100 in the candidate positions 432-434 saves area, while also providing relatively proximal temperature readings relative to the region in which the temperature-sensitive circuit 311 is located. The thermal sensor 100 is also fast, and highly accurate, allowing for greater speed and flexibility when performing temperature-dependent test procedures on the integrated circuit die 310 or individual blocks thereof (e.g., the temperature-sensitive circuit 311).

Figure 5:
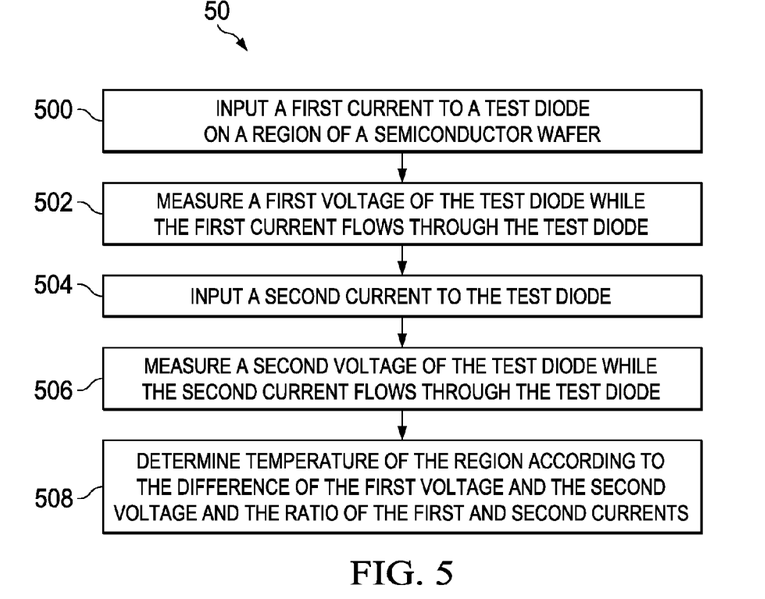
FIG. 5 is a flowchart diagram showing a process for sensing temperature in a semiconductor wafer in accordance with various embodiments of the present disclosure.

A process 50 for sensing temperature in a semiconductor wafer in accordance with various embodiments of the present disclosure is shown in FIG. 5. The process 50 is described in terms of the test system 10 shown in FIGS. 1-4. To determine temperature of the semiconductor wafer using the test system 10, a first current is inputted to the test diode 105 in block 500. The test diode 105 is located in the semiconductor wafer (e.g., near a temperature-sensitive circuit, on a test line, on a scribe line, or the like). Block 500 may be performed by the current source 110 by activating either of the current supplies 111, 112 to inject current into the test diode 105. The injection may be controlled by an operator, and/or by automatic test equipment including the current source 110 and a controller, for example. The first current inputted in block 500 may be on the order of microamperes, such as in a range of about 2 microamperes to 20 microamperes. Other ranges for the first current are also contemplated herein.

The first current injected in block 500 by the current source 110 sets up a first voltage across the test diode 105, and in block 502, the first voltage is measured as the first current is flowing through the test diode 105. The first voltage may be read by the voltage meter 120. The first current may be allowed to stabilize before the first voltage is read. The first voltage is a bandgap voltage of the test diode 105 in some embodiments. The voltage meter 120 may read the first voltage by detecting and quantizing a potential difference across the voltage pads 103, 104. The first voltage read out by the voltage meter 120 may be stored for use in calculations (e.g., in determining the temperature near the thermal sensor 100).

After completing block 502, a second current is inputted to the test diode 105 by the current source 110 in block 504. The first current may be turned off (e.g., through operation of the first switch 113) prior to activating the second current. The second current may be inputted to the test diode 105 by the second current supply 112 controlled by the second switch 114. The second current may be a multiple of the first current, or the second current may be a fraction of the first current. Magnitude of the second current may be on the order of microamperes, such as in a range of about 2 microamperes to about 20 microamperes, for example. Other ranges for the second current are also contemplated herein. The ratio of the second current to the first current may be 1/10, 1/2, 2, 10, or the like.

While keeping the second current flowing through the test diode 105, a second voltage of the test diode 105 may be measured by the voltage meter in block 506. The second current injected in block 504 by the current source 110 sets up the second voltage across the test diode 105. The second voltage may be read by the voltage meter 120. The second current may be allowed to stabilize before the second voltage is read. The second voltage is a bandgap voltage of the test diode 105 in some embodiments. The voltage meter 120 may read the second voltage by detecting and quantizing a potential difference across the voltage pads 103, 104. The second voltage read out by the voltage meter 120 may be stored for use in calculations (e.g., in determining the temperature near the thermal sensor 100).

Knowing the first voltage corresponding to the first current, and the second voltage corresponding to the second current, the temperature of the region in which the thermal sensor 100 is located can be determined in block 508. Equation (2) above can be used to determine the temperature according to the difference of the first voltage and the second voltage, and the ratio N of the first and second currents. For a ratio N of 2, a change in temperature T of 1° C. relates to a corresponding change in $\Delta V_{BE}$ of 59.7 µV, whereas for N=10, the corresponding change in $\Delta V_{BE}$ for each degree of temperature T increases to 198 µV, or about 0.2 mV. Block 508 may be performed manually by an operator, or may be performed by a processor, which may be electrically connected to the voltage meter 120.

Figure 6:
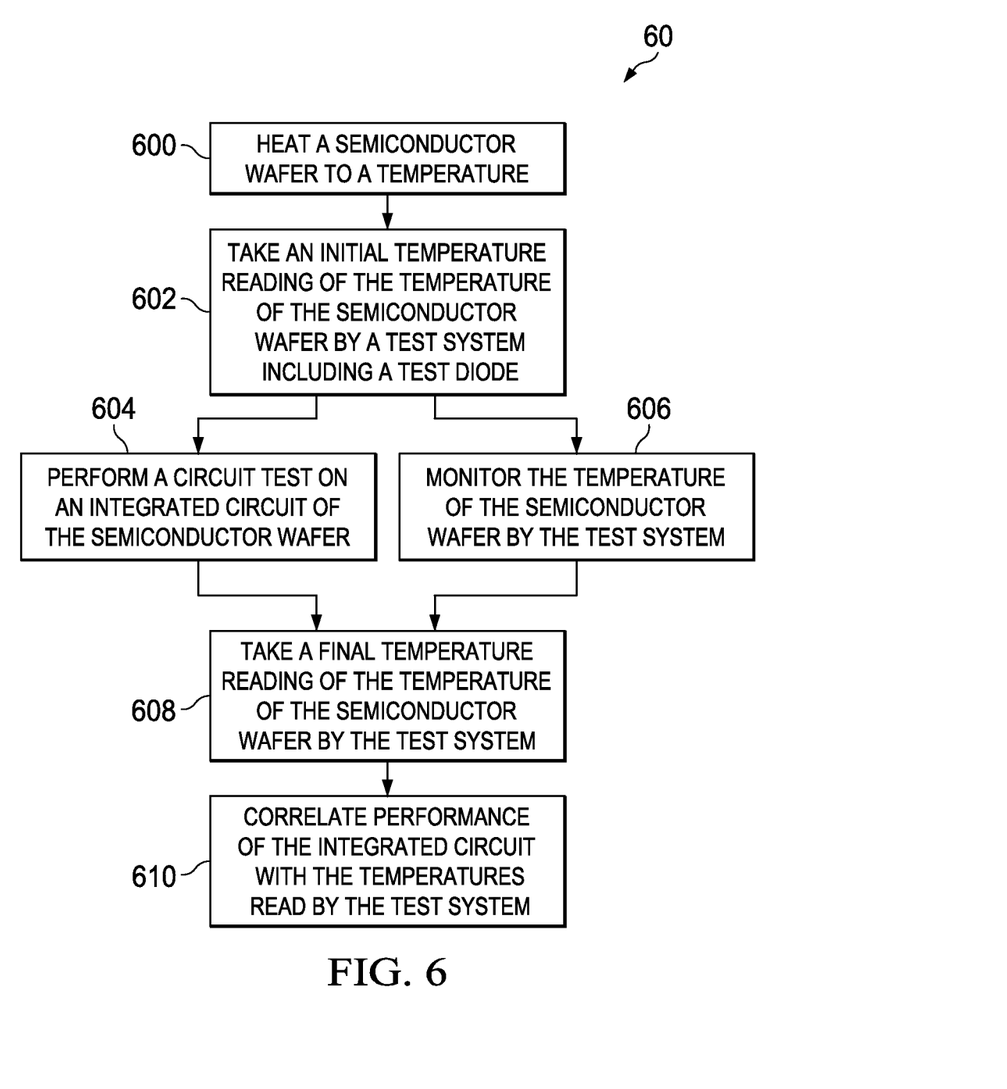
FIG. 6 is a flowchart diagram showing a test process using the thermal sensor in accordance with various embodiments of the present disclosure.
Figure 7:
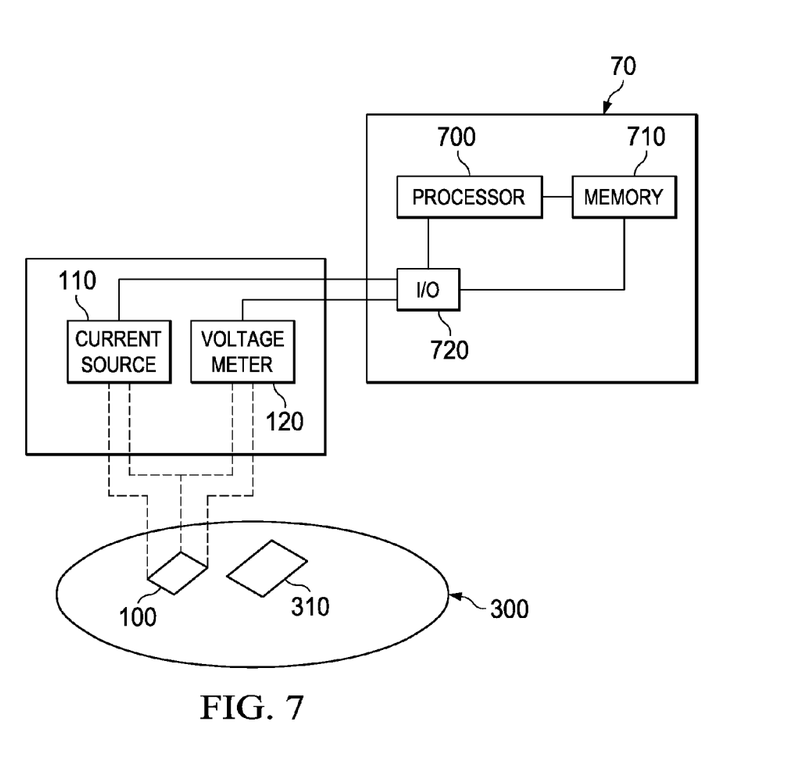
FIG. 7 illustrates a test system in which embodiments of the invention may be employed.

A test process 60 using the thermal sensor 100 in accordance with various embodiments of the present disclosure is shown in FIG. 6. The test process 60 may be run in test equipment 70 shown in FIG. 7. The test equipment 70 may be separate from the current source 110 and the voltage meter 120. In some embodiments, either or both of the current source 110 and the voltage meter 120 are included in the test equipment 70. An input/output (I/O) interface 720 may be electrically connected to the current source 110 and the voltage meter 120. A processor 700 is electrically connected to the I/O interface 720 and a memory 710, which may include volatile and non-volatile memory circuits.

When performing a temperature-dependent test procedure, the semiconductor wafer 300 is heated (or cooled) to a temperature at which performance of the integrated circuit die 310 is to be characterized in block 600. The temperature may be 0 degrees, 25 degrees, 50 degrees, 70 degrees, 85 degrees, 120 degrees, or the like. The heating or cooling may be performed in an oven held at a constant temperature, for example. An initial temperature reading may be taken by the test system 10 in block 602. The initial temperature reading may be taken using the process 50 of FIG. 5, for example. The test system 10 may include the test equipment 70, and operation of the test system 10 may be controlled by the processor 700, for example. In some embodiments, the current source 110 is controlled by the processor 700 through the I/O interface 720. The processor 700 may access parameters for the process 50 from the memory 710. The parameters may include amplitudes of the first and second currents, for example. The block 602 is optional in some embodiments. The block 602 may be repeated multiple times prior to performing the blocks 604 and 606. As an example, the processor 700 may store voltage values read in the block 602 in the memory 710, and compare a sequence of the voltage values to determine when the temperature of the wafer 300 has stabilized (e.g., when the voltage values are substantially the same for a predetermined period of time or number of measurements).

After taking the initial temperature reading, and optionally when the temperature of the wafer 300 has stabilized, circuit performance of the integrated circuit die 310 is characterized in block 604 (e.g., by performing a functional test on the die 310). In some embodiments, the block 604 may test functions of the entire die 310, sub-circuits of the die 310, or the like. A circuit test used to test the circuit performance and/or functions of the die 310 may include analog test, radio frequency test, digital test, reliability test, and the like, and may include a variety of test patterns and test parameters. Throughout the circuit test of block 604, the test system 10 may continually monitor the temperature of the semiconductor wafer 300 using the process 50 of FIG. 5 in block 606. For example, if the circuit test requires 1 minute to complete, the temperature of the wafer 300 may be taken about 100 to 150 times. The temperature may be taken at multiple time points throughout the circuit test of block 604, and the multiple time points may be at regular and/or irregular time intervals. The temperature readings taken in block 606 may be stored in the memory 710, and may be timestamped and correlated to test readings of the circuit test. Immediately following completion of the circuit test in the block 604, a final temperature reading of the semiconductor wafer 300 may be taken by the test system 10 and stored in the memory 710 in block 608. The block 608 is optional in some embodiments.

Based on the temperature and circuit performance (or pass/no pass, reliability performance) information collected by the test system 10 and the test equipment 70 in the blocks 602, 604, 606, and 608, performance of the integrated circuit die 310 may be characterized for each temperature at which the process 60 is performed in block 610. The characterization may be correlated for each temperature measured in the blocks 602, 604, 606, and 608. In some embodiments, an average temperature may be calculated from the temperatures measured in the blocks 602, 604, 606, and 608, and the performance of the integrated circuit and/or the entire integrated circuit die 310 may be characterized for the average temperature. The temperature readings taken in the process 60 may be calibrated as described above (e.g., through a lookup table stored in the memory 710). The characterization of the die 310 is rapid and accurate due to the use of the thermal sensor 100 of the test system 10 and the test equipment 70. The process 60 may also be fully automated, which increases throughput and reduces human error.

Although the Figures have been described with reference to a single die, such as the die 310, other embodiments in which a stacked die is tested using the thermal sensor 100 are also contemplated herein. The thermal sensor 100 may be integrated into a top die of the stacked die, for example. In some embodiments, the thermal sensor 100 may be integrated into an intermediate or bottom die of the stacked die, and accessible by the test system 10 through a combination of solder balls, bumps, contacts, redistribution layers, metal layers, through-substrate vias (TSVs), and the like.

The test system 10, the test equipment 70, and the processes 50 and 60 have many advantages. By arranging thermal sensors near specific, temperature-sensitive regions of integrated circuit dies, temperature data is better correlated to actual temperature at the site of the circuit test being performed. The thermal sensor 100 is also faster and more accurate than a thermal couple, not to mention being smaller and capable of flexible integration into the die 310 and/or the scribe lines 331-334 surrounding the die 310. The thermal sensor 100 may also be monitored constantly throughout the circuit test, which provides more and better temperature information for calibrating and/or characterizing circuit performance of the die 310.

In accordance with various embodiments of the present disclosure, a method includes measuring a first voltage across a test diode on a semiconductor wafer while injecting a first current into the test diode, measuring a second voltage across the test diode while injecting a second current into the test diode, and determining temperature of a region proximate the test diode according to difference between the first voltage and the second voltage.

In accordance with various embodiments of the present disclosure, a method includes heating a semiconductor wafer in an environment at a temperature, determining temperature of the semiconductor wafer by a thermal sensor circuit integrated in the semiconductor wafer, performing a circuit test on an integrated circuit of the semiconductor wafer, and correlating performance of the integrated circuit with the temperature determined by the thermal sensor.

In accordance with various embodiments of the present disclosure, a semiconductor wafer comprises an integrated circuit die, a test diode integrated into the semiconductor wafer, a first current contact electrically connected to an anode terminal of the test diode, a second current contact electrically connected to a cathode terminal of the test diode, a first voltage contact electrically connected to the anode terminal of the test diode, and a second voltage contact electrically connected to the cathode terminal of the test diode.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    heating a semiconductor wafer to a first temperature;
    determining the first temperature of the semiconductor wafer by a thermal sensor circuit integrated in the semiconductor wafer;
    performing a first reliability test on an integrated circuit of the semiconductor wafer while the semiconductor wafer is at the first temperature;
    heating the semiconductor wafer to a second temperature, the second temperature being different than the first temperature;
    determining the second temperature of the semiconductor wafer by the thermal sensor circuit;
    performing a second reliability test on the integrated circuit of the semiconductor wafer while the semiconductor wafer is at the second temperature; and
    correlating a result of the first reliability test and a result of the second reliability test of the integrated circuit with the first temperature and the second temperature determined by the thermal sensor circuit.

2. The method of claim 1, wherein determining the first temperature is performed prior to the performing the first reliability test.

3. The method claim 1, wherein determining the first temperature is performed during the performing the first reliability test.

4. The method of claim 1, wherein determining the first temperature is determining the first temperature of the semiconductor wafer at multiple time points throughout the performing the first reliability test.

5. The method of claim 1, wherein determining the first temperature of the semiconductor wafer by the thermal sensor circuit integrated in the semiconductor wafer comprises:
    measuring a first voltage across a test diode while injecting a first current into the test diode, wherein the thermal sensor circuit comprises the test diode;
    measuring a second voltage across the test diode while injecting a second current into the test diode; and
    determining the first temperature according to a difference between the first voltage and the second voltage.

6. The method of claim 5, wherein determining the second temperature of the semiconductor wafer by the thermal sensor circuit integrated comprises:
    measuring a third voltage across a test diode while injecting a third current into the test diode;
    measuring a fourth voltage across the test diode while injecting a fourth current into the test diode; and
    determining the second temperature according to a difference between the third voltage and the fourth voltage.

7. A method comprising:
    heating a semiconductor wafer, the semiconductor wafer including a thermal sensor;
    measuring a first voltage across a test diode of the thermal sensor while injecting a first current into the test diode;
    measuring a second voltage across the test diode while injecting a second current into the test diode; and
    determining a first temperature of a region proximate the test diode according to difference between the first voltage and the second voltage;
    performing a circuit test on an integrated circuit of the semiconductor wafer;
    measuring a third voltage across the test diode on the semiconductor wafer while injecting a third current into the test diode;
    measuring a fourth voltage across the test diode while injecting a fourth current into the test diode;
    determining a second temperature of the region proximate the test diode according to difference between the third voltage and the fourth voltage; and
    correlating performance of the integrated circuit with the first temperature determined by the thermal sensor, the second temperature determined by the thermal sensor, or both the first temperature and the second temperature.

8. The method of claim 7, wherein measuring the first voltage is measuring the first voltage across a test diode located on an integrated circuit die of the semiconductor wafer while injecting the first current into the test diode.

9. The method of claim 7, wherein measuring the first voltage is measuring the first voltage across the test diode located on a scribe line of the semiconductor wafer while injecting the first current into the test diode.

10. The method of claim 7, wherein measuring the first voltage is measuring the first voltage across the test diode located proximate to a temperature-sensitive circuit of an integrated circuit die of the semiconductor wafer while injecting the first current into the test diode.

11. The method of claim 7, wherein measuring the first voltage is measuring the first voltage across a PN junction in the semiconductor wafer while injecting the first current into the PN junction.

12. The method of claim 7, wherein measuring the first voltage is measuring the first voltage across a diode-connected bipolar junction transistor in the semiconductor wafer while injecting the first current into the diode-connected bipolar junction transistor.

13. The method of claim 7, wherein determining the first temperature is determining a temperature of the region proximate the test diode according to the difference between the first voltage and the second voltage and according to a calibration lookup table.

14. The method of claim 7, wherein measuring the second voltage is measuring the second voltage across the test diode while injecting the second current having magnitude greater than magnitude of the first current into the test diode.

15. The method of claim 7, wherein measuring the second voltage is measuring the second voltage across the test diode while injecting the second current having magnitude less than magnitude of the first current into the test diode.

16. A method comprising:
heating a semiconductor wafer having an integrated circuit formed therein;
taking an initial temperature reading of a region of the semiconductor wafer using a test system including a test diode formed on the semiconductor wafer, wherein taking the initial temperature reading comprises:
measuring a first voltage across the test diode while injecting a first current into the test diode, wherein the test diode is proximate to the region of the semiconductor wafer;
measuring a second voltage across the test diode while injecting a second current into the test diode; and
determining the initial temperature reading of the region according to a difference between the first voltage and the second voltage;
performing a circuit test on the integrated circuit to determine performance of the integrated circuit;
taking a final temperature reading of the region of the semiconductor wafer using the test system; and
correlating the performance of the integrated circuit with the initial temperature reading and the final temperature reading.

17. The method of claim 16, further comprising monitoring the temperature of the region of the semiconductor wafer during the step of performing a circuit test.

18. The method of claim 16, wherein the test diode comprises a diode-connected bipolar junction transistor.

19. The method of claim 16, wherein the step of correlating performance includes correlating performance of the integrated circuit with an average of temperatures determined by the test system at multiple time points.

20. The method of claim 16, wherein taking the final temperature reading of the region of the semiconductor wafer using the test system comprises:
measuring a third voltage across the test diode while injecting a third current into the test diode;
measuring a fourth voltage across the test diode while injecting a fourth current into the test diode; and
determining the final temperature reading of the region according to a difference between the third voltage and the fourth voltage.

* * * * *